United States Patent
Lee et al.

(10) Patent No.: US 11,798,645 B2
(45) Date of Patent: Oct. 24, 2023

(54) STORAGE DEVICE FOR PERFORMING RELIABILITY CHECK BY USING ERROR CORRECTION CODE (ECC) DATA

(71) Applicant: Samsung Electronics Co., Ltd., Suwon-si (KR)

(72) Inventors: Jiseok Lee, Seoul (KR); Hwangju Song, Suwon-si (KR); Namyong Kim, Seoul (KR); Jaeeun Yoon, Yongin-si (KR); Sangmu Lee, Hwaseong-si (KR); Sangwon Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 17/467,968

(22) Filed: Sep. 7, 2021

(65) Prior Publication Data

US 2022/0208294 A1  Jun. 30, 2022

(30) Foreign Application Priority Data

Dec. 30, 2020 (KR) ......... 10-2020-0188210

(51) Int. Cl.
| | | |
|---|---|---|
| *G11C 29/42* | (2006.01) | |
| *G11C 29/12* | (2006.01) | |
| *G11C 16/34* | (2006.01) | |
| *G11C 16/26* | (2006.01) | |
| *G11C 16/10* | (2006.01) | |

(52) U.S. Cl.
CPC ......... *G11C 29/42* (2013.01); *G11C 16/102* (2013.01); *G11C 16/26* (2013.01); *G11C 16/3495* (2013.01); *G11C 29/12005* (2013.01)

(58) Field of Classification Search
CPC ....... G11C 29/42; G11C 16/102; G11C 16/26; G11C 16/3495; G11C 29/12005
See application file for complete search history.

(56) References Cited

U.S. PATENT DOCUMENTS

| | | |
|---|---|---|
| 7,024,598 B2 | 4/2006 | Jeong et al. |
| 7,428,180 B2 | 9/2008 | Kim |
| 7,679,133 B2 | 3/2010 | Son et al. |
| 8,245,101 B2 | 8/2012 | Olbrich et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,793,555 B2 | 7/2014 | Hida et al. |

(Continued)

OTHER PUBLICATIONS

Taiwanese Office Action dated Sep. 7, 2022 issued in Taiwanese Patent Application No. 110144860.

*Primary Examiner* — Vanthu T Nguyen
(74) *Attorney, Agent, or Firm* — Harness, Dickey & Pierce, P.L.C.

(57) ABSTRACT

A storage device for performing a reliability check by using error correction code (ECC) data is provided. The storage device includes a memory controller configured to detect the number of errors of second read data read out by a second read operation, based on ECC data of first read data read by a first read operation of a memory device. The memory controller includes a memory check circuit that includes a counter configured to count states of memory cells, a comparator configured to compare respective count numbers of the states with one another, and a register configured to store the number of errors based on a result of the comparison.

19 Claims, 16 Drawing Sheets

(56) References Cited

U.S. PATENT DOCUMENTS

| | | | |
|---|---|---|---|
| 9,032,264 B2 * | 5/2015 | Hashimoto | G11C 29/08 |
| | | | 714/719 |
| 9,036,412 B2 | 5/2015 | Choi et al. | |
| 9,465,537 B2 | 10/2016 | Nishikubo et al. | |
| 10,014,060 B2 | 7/2018 | Tuers et al. | |
| 10,157,093 B2 | 12/2018 | Cunningham et al. | |
| 10,223,028 B2 | 3/2019 | Gorobets et al. | |
| 10,319,460 B2 | 6/2019 | Kern et al. | |
| 10,332,613 B1 * | 6/2019 | Micheloni | G11C 29/028 |
| 10,346,232 B2 | 7/2019 | Shulkin et al. | |
| 10,629,247 B2 * | 4/2020 | Kale | G11C 7/14 |
| 10,866,860 B2 * | 12/2020 | Kurose | G11C 16/26 |
| 2011/0233648 A1 | 9/2011 | Seol et al. | |
| 2014/0025866 A1 | 1/2014 | Kim et al. | |

* cited by examiner

STORAGE DEVICE FOR PERFORMING RELIABILITY CHECK BY USING ERROR CORRECTION CODE (ECC) DATA

CROSS-REFERENCE TO RELATED APPLICATION

This application is based on and claims priority under 35 U.S.C. § 119 to Korean Patent Application No. 10-2020-0188210, filed on Dec. 30, 2020, in the Korean Intellectual Property Office, the disclosure of which is incorporated by reference herein in its entirety.

BACKGROUND

The inventive concepts relate to semiconductor devices, and more particularly, to storage devices that are capable of performing a reliability check by using error correction code (ECC) data, and/or operation methods of the storage device.

A system using semiconductor chips widely uses a dynamic random-access memory (DRAM) as an operation memory or main memory of the system and uses a storage device as a storage medium, in order to store data or instructions used by a host within the system and/or perform a computational operation. The storage device includes a non-volatile memory. As the capacity of the storage device increases, the number of memory cells and the number of word lines stacked on a substrate of a non-volatile memory increase, and the number of bits of data stored in a memory cell also increases. In order to improve the storage capacity and integration of a memory, a non-volatile memory device where memory cells are stacked in a three-dimensional (3D) structure, for example, a 3D NAND flash memory is being studied.

With a decrease in the scale of 3D NAND flash memory and a change in the structure thereof, various problems not previously known are being discovered. The various newly discovered problems may destroy data stored in a storage device, thereby impairing reliability of the storage device.

SUMMARY

The inventive concepts provide storage devices that are capable of performing a reliability check during a short time period by using error correction code (ECC) data, and/or operation methods of the storage device.

According to an aspect of the inventive concepts, a storage device may include a non-volatile memory device including a plurality of memory blocks, each of the plurality of memory blocks including memory cells connected to a plurality of word lines, the memory cells configured to be programmed into a plurality of states according to write data, and a memory controller configured to check reliability of first memory cells, from among the memory cells, connected to a selection word line from among the plurality of word lines, wherein the memory controller is further configured to perform a first read operation with respect to the memory cells connected to the selection word line, obtain error-corrected data by performing error correction decoding on first read data read out by the first read operation, perform a second read operation with respect to the memory cells connected to the selection word line, and count a number of errors of second read data read out by the second read operation, based on the error-corrected data.

According to another aspect of the inventive concepts, a memory controller for checking reliability of a memory may include an error correction code (ECC) circuit configured to obtain error-corrected data by performing error correction decoding on first read data read out in a first read operation with respect to first memory cells connected to a selection word line of the memory device, and a memory check circuit configured to detect a number of errors of second read data read out in a second read operation with respect to the first memory cells connected to the selection word line, based on the error-corrected data.

According to another aspect of the inventive concepts, an operation method of a storage device, which includes at least one non-volatile memory device and a memory controller configured to control the at least one non-volatile memory device, may include performing, by the memory controller, a first read operation with respect to first memory cells, which are programmed into a plurality of states according to write data and are connected to a selection word line of a selected memory block from among memory blocks of the at least one non-volatile memory device, obtaining, by the memory controller, error-corrected data by performing error correction decoding on first read data read out in the first read operation, calculating, by the memory controller, a first count number of each state by counting states of the error-corrected data, performing, by the memory controller, a second read operation with respect to the first memory cells connected to the selection word line, calculating, by the memory controller, a second count number of each state by counting states of second read data read out by the second read operation, counting, by the memory controller, a number of errors of the second read data based on the first count number of each state and the second count number of each state, and performing, by the memory controller, a reclaim operation of the memory device, based on the number of the errors of the second read data.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
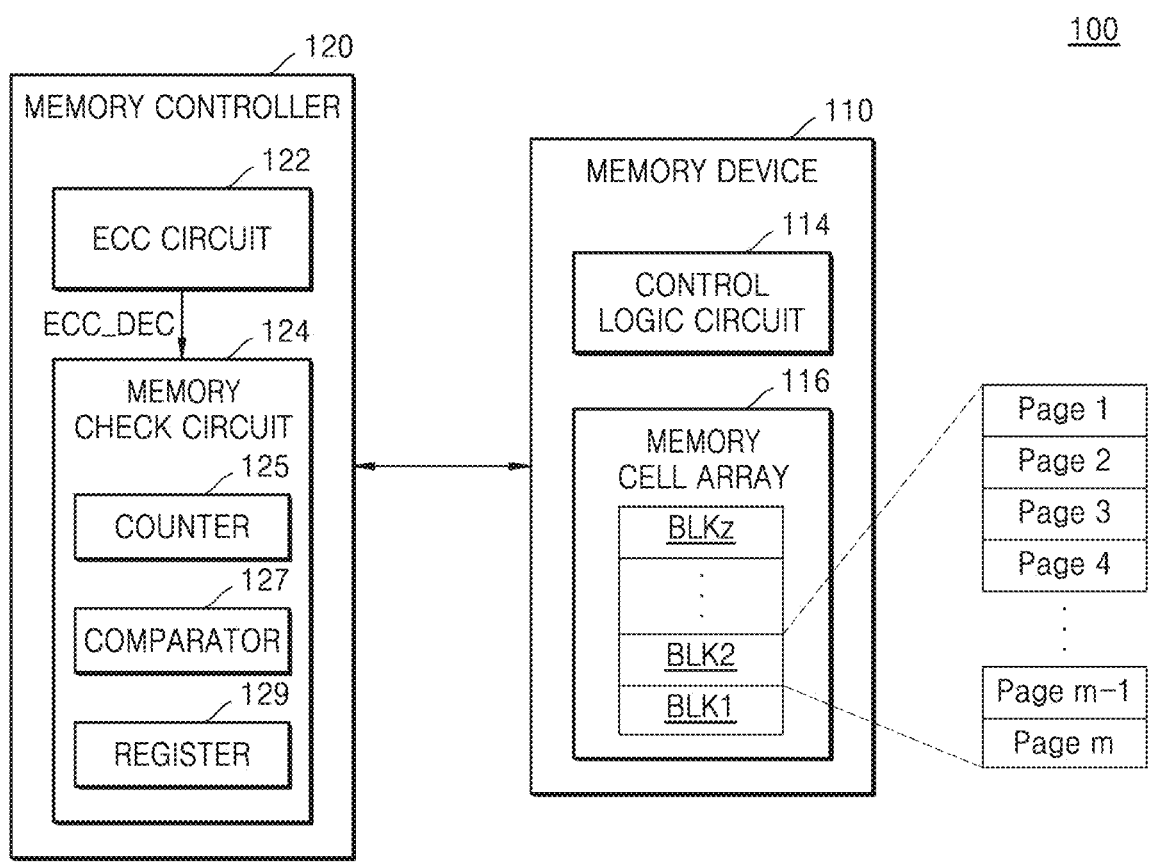
FIG. 1 is a block diagram of a storage device according to an example embodiment of the inventive concepts.

FIG. 1 is a block diagram of a storage device 100 according to an example embodiment of the inventive concepts.

Referring to FIG. 1, the storage device 100 may include a memory device 110 and a memory controller 120. According to the present example embodiment, a number of conceptual hardware configurations included in the storage device 100 are shown, but example embodiments are not limited thereto and other configurations are possible. The memory controller 120 may control the memory device 110 such that data is written to the memory device 110 in response to a write request from a host, or may control the memory device 110 such that data is read from the memory device 110 in response to a read request from the host.

According to some example embodiments, the storage device 100 may be internal memory embedded in an electronic apparatus. For example, the storage device 100 may be an embedded Universal Flash Storage (UFS) memory device, an embedded Multi-Media Card (eMMC), or a solid state drive (SSD). According to some example embodiments, the storage device 100 may be external memory detachable from an electronic apparatus. For example, the storage device 100 may include at least one of a UFS memory card, Compact Flash (CF), Secure Digital (SD), Micro-SD, Mini-SD, extreme Digital (xD), and a Memory Stick.

The memory device 110 may perform a write operation or a read operation under the control of the memory controller 120. The memory device 110 may receive a command and an address from the memory controller 120 through input/output lines, and transmits or receives data for a write operation or a read operation to or from the memory controller 120. The memory device 110 may receive control signals through control lines. The memory device 110 may include a control logic circuit 114 and a memory cell array 116.

The control logic circuit 114 may control various overall operations of the memory device 110. The control logic circuit 114 may receive a command/address from the memory controller 120. The control logic circuit 114 may generate control signals for controlling other components of the memory device 110 according to the received command/address. For example, the control logic circuit 114 may generate various control signals for writing data to the memory cell array 116 or reading data from the memory cell array 116.

The memory cell array 116 may store the data received from the memory controller 120, under the control of the control logic circuit 114. The memory cell array 116 may output the stored data to the memory controller 120, under the control of the control logic circuit 114.

The memory cell array 116 may include a plurality of memory cells. For example, the plurality of memory cells may be flash memory cells. However, the inventive concepts are not limited thereto, and the memory cells may be Resistive Random Access Memory (RRAM) cells, Ferroelectric RAM (FRAM) cells, Phase change RAM (PRAM) cells, Thyristor RAM (TRAM) cells, and Magnetic RAM (MRAM) cells. Some example embodiments of the inventive concepts will now be described in detail by focusing on an example in which the plurality of memory cells are NAND flash memory cells.

The memory cell array 116 may include a plurality of memory blocks BLK1 through BLKz (where z is an integer equal to or greater than 2), and each of the plurality of memory blocks BLK1 through BLKz may include a plurality of pages Page1 through Pagem (where m is an integer equal to or greater than 2). The memory cell array 116 may include a three-dimensional (3D) memory cell array including a plurality of cell strings. This will be described later in detail with reference to FIGS. 3 and 4.

The memory controller 120 may perform a first read operation and a second read operation with respect to the memory device 110, in order to perform a reliability check of the memory device 110. The memory controller 120 may include an error correction code (ECC) circuit 122 and a memory check circuit 124. The ECC circuit 122 may generate an ECC for correcting a fail bit or an error bit of the data transmitted/received to/from the memory device 110. The ECC circuit 122 may configure write data to which a parity bit has been added, by performing error correction encoding of write data that is provided to the memory device 110. The parity bit may be stored in the memory device 110. The ECC circuit 122 may perform error correction decoding with respect to read data output by the memory device 110. The ECC circuit 122 may obtain error-corrected ECC data ECC_DEC by performing error correction on first read data read by the first read operation by using parity bits. The ECC circuit 122 may correct an error by using coded modulation such as a low density parity check (LDPC) code, a BCH code, a turbo code, a Reed-Solomon code, a convolution code, a recursive systematic code (RSC), trellis-coded modulation (TCM), or block coded modulation (BCM).

The memory check circuit 124 may perform a reliability check operation on the memory device 110, based on the error-corrected ECC data ECC_DEC. The memory check circuit 124 may include a counter 125, a comparator 127, and a register 129. The counter 125 may calculate a first count number of each state by counting the states of the error-corrected data ECC_DEC, and may count a second count number of each state by counting the states of second read data read by the second read operation. The comparator 127 may compare the first count number of each state with the second count number of each state, and the register 129 may store the number of errors of the second read data, based on a result of the comparison by the comparator 127. Because the memory check circuit 124 counts the number of errors of the second read data, based on the ECC data ECC_DEC of the first read data, the memory check circuit 124 may perform a reliability check during a relatively short time period.

Figure 2:
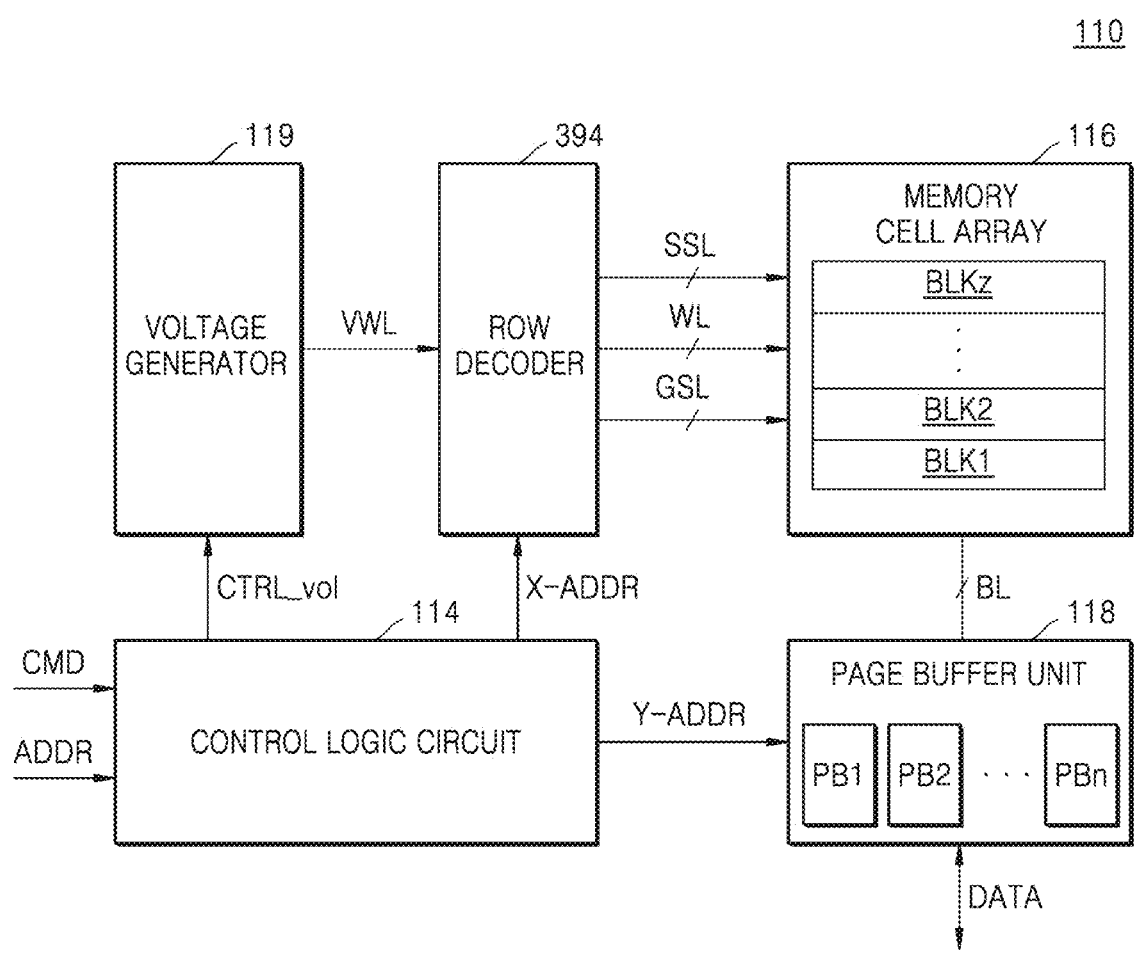
FIG. 2 is a block diagram of a memory device illustrated in FIG. 1.

FIG. 2 is a block diagram of the memory device 110 illustrated in FIG. 1.

Referring to FIGS. 1 and 2, the memory device 110 may include a control logic circuit 114, a memory cell array 116, a page buffer unit 118, a voltage generator 119, and a row decoder 394. Although not shown in FIG. 2, the memory device 110 may further include a command decoder, an address decoder, an input/output (I/O) circuit, and the like.

The control logic circuit 114 may control various overall operations of the memory device 110. The control logic circuit 114 may output various control signals in response to a command CMD and/or an address ADDR from the memory controller 120. For example, the control logic circuit 114 may output a voltage control signal CTRL_vol, a row address X-ADDR, and a column address Y-ADDR.

The memory cell array 116 may include a plurality of memory blocks BLK1 through BLKz, and each of the plurality of memory blocks BLK1 through BLKz may include a plurality of memory cells. The memory cell array 116 may be connected to the page buffer unit 118 via bit lines BL, and may be connected to the row decoder 394 via word lines WL, string selection lines SSL, and ground selection lines GSL.

According to an example embodiment, the memory cell array 116 may include a 3D memory cell array, and the 3D memory cell array may include a plurality of memory NAND strings. Each memory NAND string may include memory cells respectively connected to word lines vertically stacked on a substrate. U.S. Pat. Nos. 7,679,133, 8,553,466, 8,654,587, 8,559,235, and US 2011/0233648 are hereby incorporated by reference. According to an example embodiment, the memory cell array 116 may include a two-dimensional (2D) memory cell array, and the 2D memory cell array may include a plurality of memory NAND strings arranged in a column direction and a row direction.

The page buffer unit 118 may include a plurality of page buffers PB1 through PBn (where n is an integer equal to or greater than 2), and the plurality of page buffers PB1 through PBn may be connected to the memory cells via the plurality of bit lines BL, respectively. The page buffer unit 118 may select at least one bit line from the plurality of bit lines BL in response to the column address Y-ADDR. The page buffer circuit 118 may operate as a write driver or a sense amplifier according to operation modes. For example, during a program operation, the page buffer circuit 118 may apply a bit line voltage corresponding to data that is to be programmed to a selected bit line. During a read operation, the page buffer circuit 118 may sense a current or voltage of the selected bit line to sense the data stored in a memory cell.

The voltage generator 119 may generate various types of voltages for performing program, read, and erase operations, based on the voltage control signal CTRL_vol. For example, the voltage generator 119 may generate word line voltages VWL (e.g., a program voltage, a read voltage, a program verify voltage, and an erase voltage).

The row decoder 394 may select one word line from the plurality of word lines WL in response to the row address X-ADDR, and may select one string selection line from the plurality of string selection lines SSL. For example, during a program operation, the row decoder 394 may apply a program voltage and a program verify voltage to the selected word line, and, during a read operation, the row decoder 394 may apply a read voltage to the selected word line.

Figure 3:
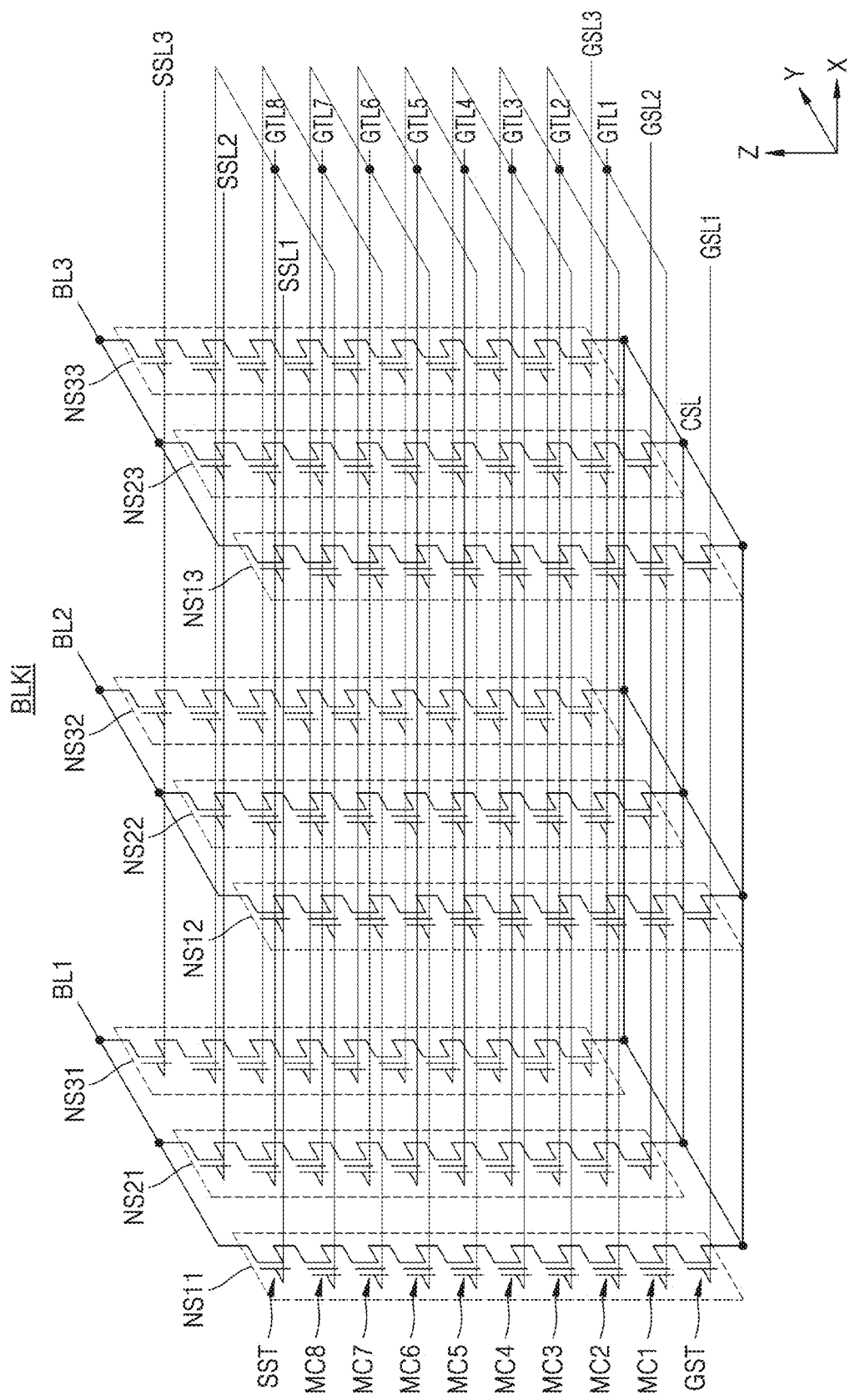
FIGS. 3 through 5 are diagrams for explaining a 3D V-NAND structure applicable to the memory device of FIG. 2.
Figure 4:
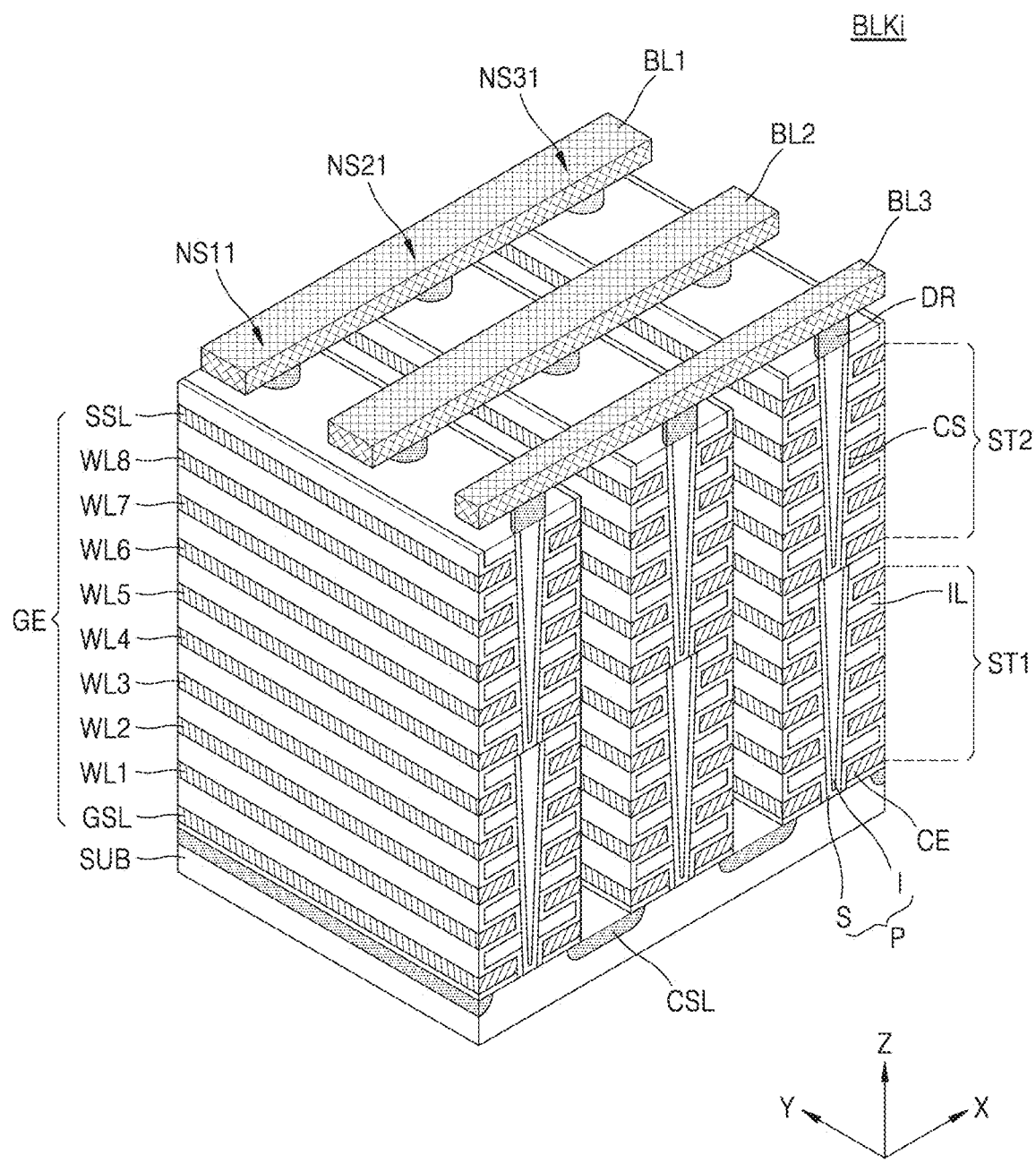
Figure 5:
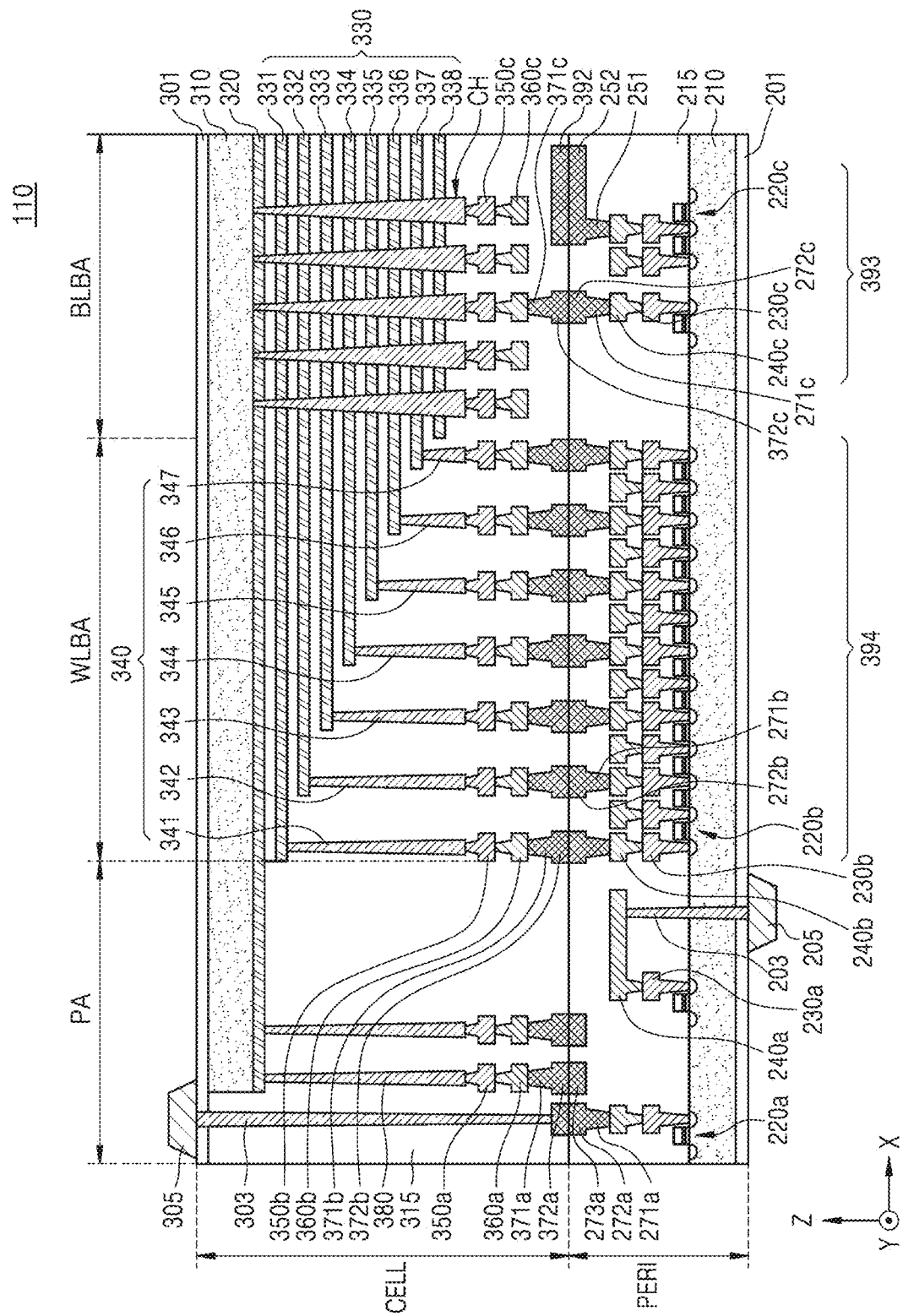

FIGS. 3 through 5 are diagrams for explaining a 3D V-NAND structure applicable to the memory device 110 of FIG. 2. FIG. 3 is an equivalent circuit of a memory block BLKi, and FIG. 4 is a perspective view of the memory block BLKi. FIG. 5 explains a memory device 110 having a chip-to-chip (C2C) structure.

Referring to FIG. 3, the memory block BLKi may include a plurality of memory NAND strings NS11 through NS33 connected between bit lines BL1, BL2, and BL3 and a common source line CSL. Each of the plurality of memory NAND strings NS11 through NS33 may include a string select transistor SST, a plurality of memory cells MC1, MC2, through to MC8, and a ground select transistor GST. For brevity of illustration, each of the plurality of memory NAND strings NS11 through NS33 includes the eight memory cells MC1, MC2, through to MC8 in FIG. 3. However, example embodiments are not limited thereto.

The string select transistor SST may be connected to a corresponding one of string selection lines SSL1, SSL2, and SSL3. The plurality of memory cells MC1, MC2, through to MC8 may be connected to gate lines GTL1, GTL2, through to GTL8, respectively. The gate lines GTL1, GTL2, through to GTL8 may correspond to word lines, and some of the gate lines GTL1, GTL2, through to GTL8 may correspond to dummy word lines. The ground select transistor GST may be connected to a corresponding one of ground selection lines GSL1, GSL2, and GSL3. The string select transistor SST may be connected to a corresponding one of the bit lines BL1, BL2, and BL3, and the ground select transistor GST may be connected to the common source line CSL.

Gate lines (for example, GTL1) on the same level may be commonly connected to one another, and the ground selection lines GSL1, GSL2, and GSL3 and the string selection lines SSL1, SSL2, and SSL3 may be separated from one another. Although the memory block BLKi is connected to the eight gate lines GTL1, GTL2, through to GTL8 and the three bit lines BL1, BL2, and BL3 in FIG. 3, example embodiments are not limited thereto.

Referring to FIGS. 3 and 4, the memory block BLKi is formed in a vertical direction with respect to a substrate SUB. Memory cells that constitute the memory NAND strings NS11 through NS33 are stacked on a plurality of semiconductor layers.

Common source lines CSL each extending in a first direction (Y direction) are provided on the substrate SUB. On a portion of the substrate SUB between two adjacent common source lines CSL, a plurality of insulation layers IL each extending in the first direction (Y direction) may be provided sequentially in a third direction (Z direction), and the plurality of insulation layers IL may be spaced apart from one another by a specific distance in the third direction (Z direction). A plurality of pillars P sequentially arranged in the first direction (Y direction) and penetrating through the plurality of insulation layers IL in the third direction (Z direction) are provided on the portion of the substrate SUB between two adjacent common source lines CSL. The plurality of pillars P may penetrate through the plurality of insulation layers IL and contact the substrate SUB. A surface layer S of each of the plurality of pillars P may include a silicon material doped with impurities of a first conductive type, and may function as a channel region. An internal layer I of each of the plurality of pillars P may include an insulating material such as silicon oxide, or an air gap. On the portion of the substrate SUB between two adjacent common source lines CSL, a charge storage layer CS is provided along the insulation layers IL, the pillars P, and an exposed surface of the substrate SUB. The charge storage layer CS may include a gate insulation layer (or a tunneling insulation layer), a charge trapping layer, and a blocking insulation layer. On the portion of the substrate SUB between two adjacent common source lines CSL, a gate electrode GE such as the string and ground selection lines GSL and SSL and word lines WL1 through WL8 is provided on an exposed surface of the charge storage layer CS. Drains or drain contacts DR may be provided on the plurality of pillars P. The bit lines BL1 through BL3 each extending in the second direction (X direction) and spaced apart from one another by a specific distance in the first direction (Y direction) may be provided on the drain contacts DR.

As shown in FIG. 4, each of the memory NAND strings NS11 through NS33 may be implemented as a structure in which a first memory stack ST1 and a second memory stack ST2 are stacked. The first memory stack ST1 is connected to the common source line CSL, the second memory stack ST2 is connected to the bit lines BL1 through BL3, and the first memory stack ST1 and the second memory stack ST2 are stacked to share different channel holes.

Referring to FIG. 5, a memory device 110 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. Example embodiment, however, may not be limited thereto. For example, the bonding metals may also be formed of aluminum (Al) or tungsten (W).

Each of the peripheral circuit region PERI and the cell region CELL of the memory device 110 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrate in FIG. 5, although only the first metal layers 230a, 230b, and 230c and the second metal layers 240a, 240b, and 240c are shown and described, example embodiments are not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (or collectively 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 5, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (or collectively, 340). The plurality of word lines 330 and the plurality of cell contact plugs 340 may be connected to each other in pads provided by at least a portion of the plurality of word lines 330, which extend in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 5, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. Further, a side insulating film (not shown) may be disposed between the first input-output contact plug 203 and the first substrate 210 to electrically separate the first input-output contact plug 203 and the first substrate 210.

Referring to FIG. 5, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to some example embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 5, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to some example embodiments, the first input-output pad 205 and the second input-output pad 305 may be selectively formed. For example, the memory device 110 may include only the first input-output pad 205 disposed on the first substrate 210 or the second input-output pad 305 disposed on the second substrate 310. In some example embodiments, the memory device 110 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 110 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL. Lower bonding metals 272a and 271a may be formed in the external pad bonding area PA. In the external pad bonding area PA, the 1 Lower bonding metals 272a and 271a of the peripheral circuit region PERI may be electrically connected to the upper metal pattern 372a of the cell region CELL by a Cu-to-Cu bonding.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI and a lower bonding metal 251 connected to the lower metal pattern 252, and having the same cross-sectional shape as the lower metal pattern 252 of the peripheral circuit region PERI, may be formed in an uppermost metal layer of the cell region CELL. A contact may not be formed on at least some of the upper metal patterns 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 6:
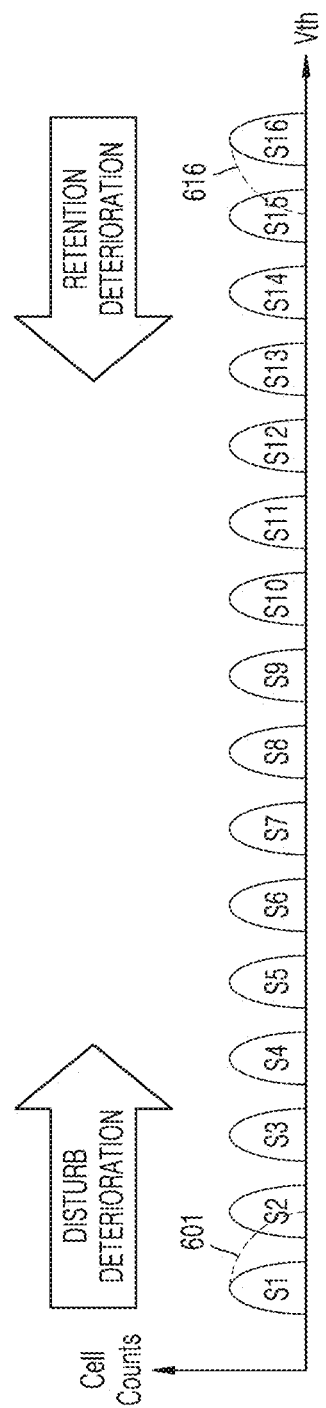
FIG. 6 illustrates a threshold voltage distribution when write data is written to memory cells of FIG. 3.

FIG. 6 illustrates a threshold voltage distribution when write data is written to the memory cells of FIG. 3. In FIG. 6, a horizontal axis indicates threshold voltages of the memory cells, and a vertical axis indicates cell counts, namely, the number of memory cells.

Referring to FIGS. 3 and 6, one or more bits may be programmed to a memory cell. A memory cell may be classified as a Single-Level Cell (SLC), a Multi-Level Cell (MLC), Triple-Level Cell (TLC), or a Quad-Level Cell (QLC) according to the number of bits stored in the memory cell. A memory cell may have a plurality of states according to the number of bits stored in the memory cell. Each of the plurality of states may be defined as a range of threshold voltages. In FIG. 6, the memory cell is a QLC, and the threshold voltage of the memory cell may be programmed as one of sixteen states S1 through S16. Each of the states S1 through S16 may correspond to a threshold voltage (Vth) distribution range of memory cells.

After data is programmed to memory cells, the states S1 through S16 of the memory cells may be distinguished from one another, as shown by solid lines in FIG. 6. After data is programmed to the memory cells, due to various factors, states of the memory cells may invade the ranges of other states, as shown by dashed lines in FIG. 6.

For example, like a first dashed line 601, a threshold voltage Vth of memory cells in the state S1 may invade the range of the state S2. This invasion may be referred to as disturb deterioration. The disturb deterioration refers to a change in the threshold voltages of the memory cells due to programming, reading, erasing, coupling, or the like occurring around the memory cells.

In some example embodiments, like a second dashed line 616, a threshold voltage Vth of memory cells in the state S16 may invade the range of the state S15. This invasion may be referred to as retention deterioration. The retention deterioration refers to a change in the threshold voltages of the memory cells due to outflow of charges captured over time, after charges are captured in a charge capturing layer of a memory cell and thus the memory cell is programmed.

The disturb deterioration described above with reference to the state S1 and the retention deterioration described above with reference to the state S16 may occur even in the memory cells in the states S2 through S15. When the disturb deterioration and/or the retention deterioration occur in a memory cell, data of the memory cell may be deteriorated or destroyed. The data destruction causes decreases in reliabilities of the storage device 100 of FIG. 1 and the memory device 110.

To mitigate or prevent this problem, the storage device 100 according to some example embodiments of the inventive concepts may perform a check read operation including a first read operation using read voltages and a second read operation using low read voltages and/or a high read voltage following the first read operation. In the check read operation, it may be checked whether reliability of data written to the memory cells decreases, by outputting error-corrected ECC data (or ECC data) obtained by the ECC circuit 122 error-correcting the data read-out in the first read operation, and comparing the ECC data with data read-out in the second read operation.

Figure 7:
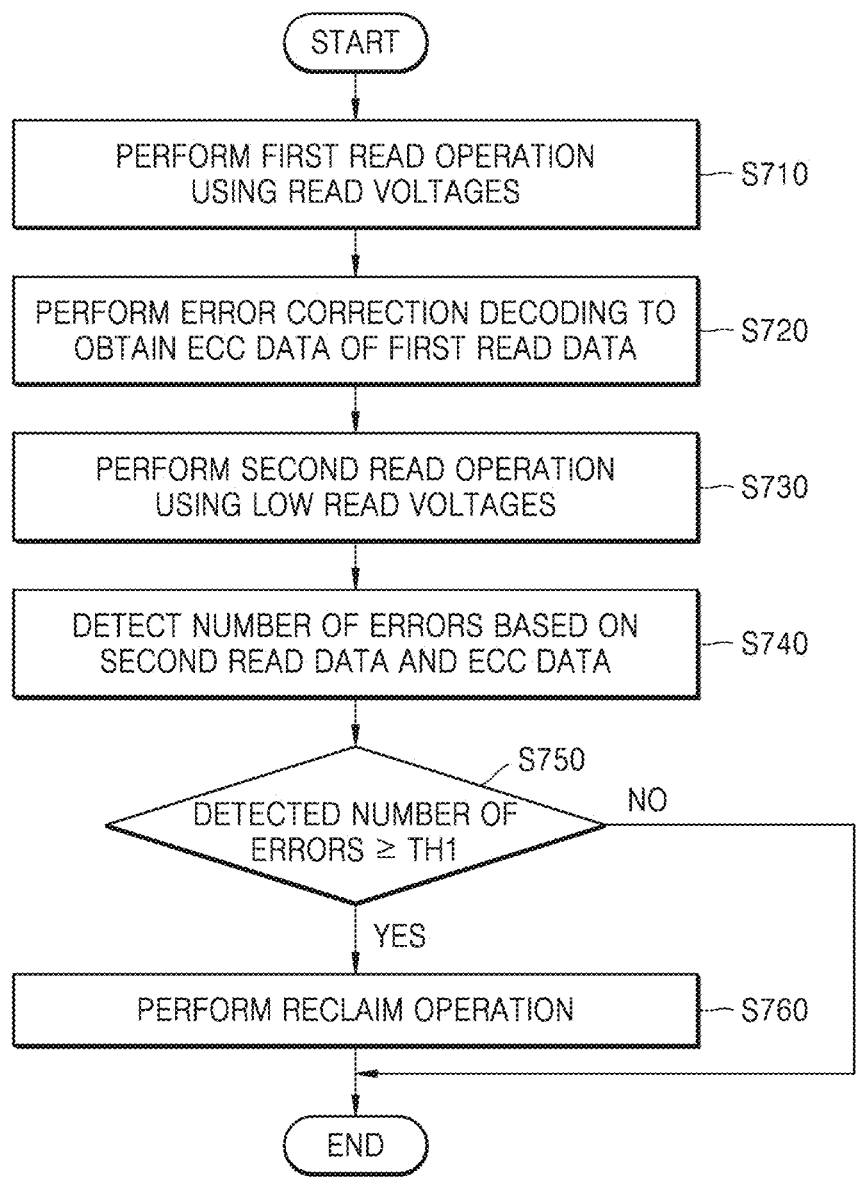
FIGS. 7 through 9B are views for explaining a check read operation according to an example embodiment of the inventive concepts.
Figure 8:
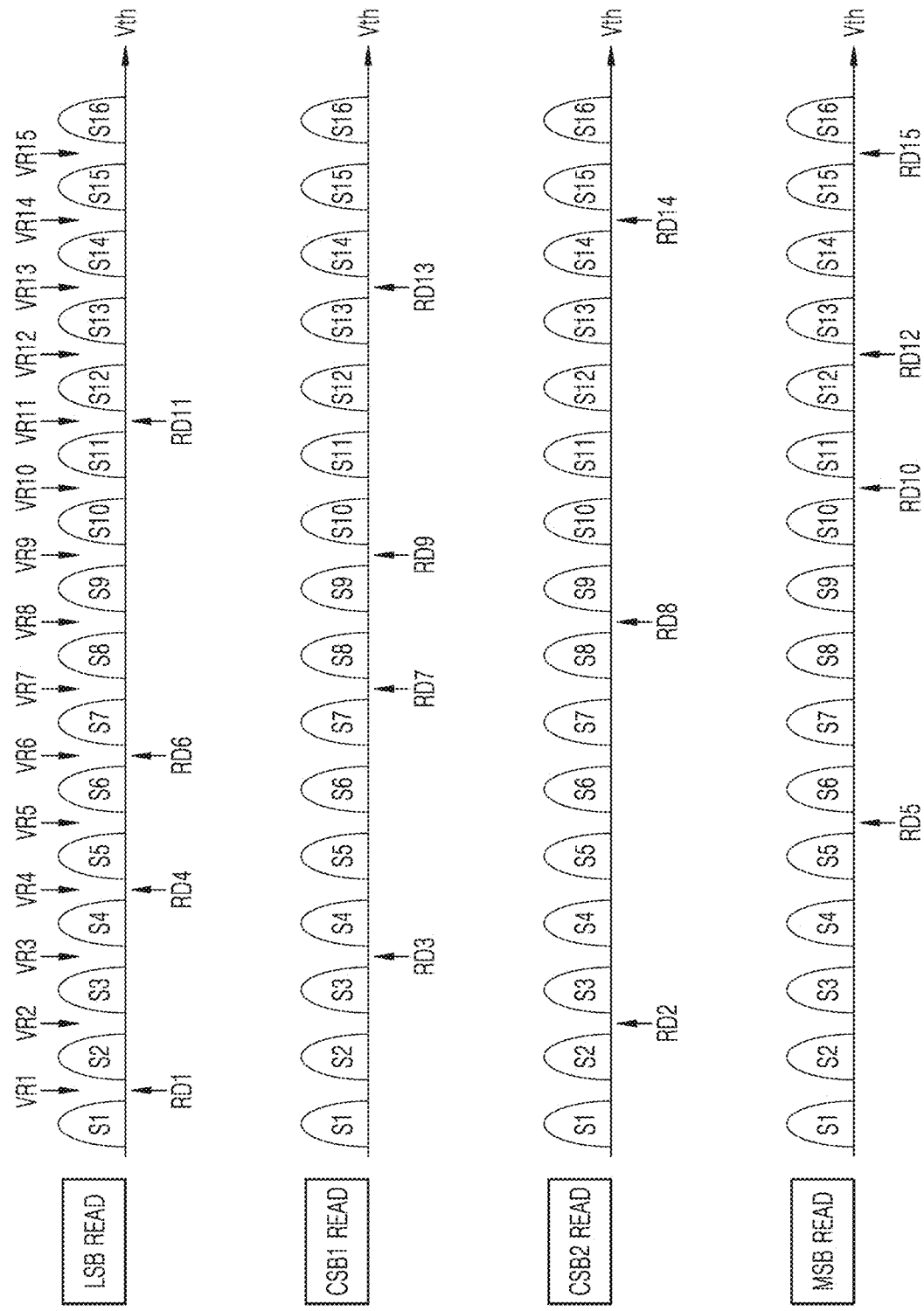
Figure 9A:
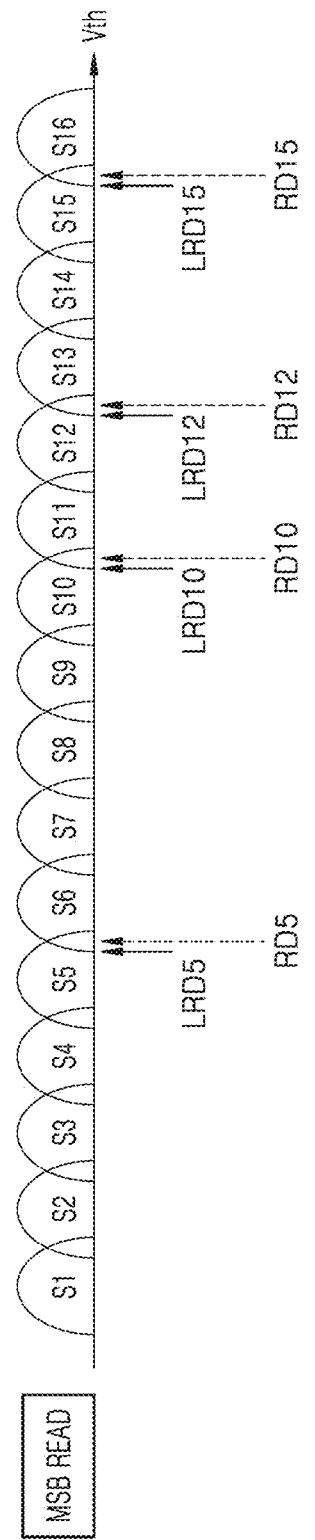
Figure 9B:
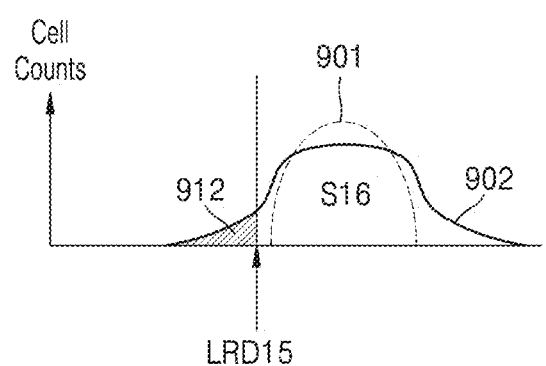

FIGS. 7 through 9B are views for explaining a check read operation according to an example embodiment of the inventive concepts. FIG. 7 is a flowchart of the check read operation, FIG. 8 is a chart for explaining a first read operation included in the check read operation, and FIGS. 9A and 9B are charts for explaining a second read operation included in the check read operation.

Referring to FIGS. 1, 6, and 7, in operation S710, the memory controller 120 may instruct the memory device 110 to perform the first read operation. When each of the memory cells of the memory device 110 is a QLC, a state of each of the memory cells may correspond to one of the sixteen states S1 through S16. Memory cells connected to one word line WL may include a least significant bit (LSB) page, a first central significant bit (CSB1) page, a second central significant bit (CSB2) page, and a most significant bit (MSB) page.

As shown in FIG. 8, the first read operation of the memory device 110 may include an operation of searching for valley locations VR1 through VR15 of the threshold voltages of memory cells, an operation of inferring optimal read voltages RD1 through RD15, based on the valley locations VR1 through VR15, and a page read operation with respect to each of the LSB page, the CSB1 page, the CSB2 page, and the MSB page by using the optimal read voltages RD1 through RD15.

Referring to FIG. 8, the first read operation is performed with respect to a selection word line WL to which memory cells to be checked are connected. In a read operation with respect to the LSB page, the memory device 110 may identify the eleventh and twelfth states S11 and S12 by applying the eleventh read voltage RD11 to the selection word line WL, and then may identify the sixth and seventh states S6 and S7, the fourth and fifth states S4 and S5, and the first and second states S1 and S2 by sequentially applying the sixth read voltage RD6, the fourth read voltage RD4, and the first read voltage RD1 to the selection word line WL. In a read operation with respect to the CSB1 page, the memory device 110 may identify the thirteenth and fourteenth states S13 and S14, the ninth and tenth states S9 and S10, the seventh and eighth states S7 and S8, and the third and fourth states S3 and S4 by sequentially applying the thirteenth read voltage RD13, the ninth read voltage RD9, the seventh read voltage RD7, and the third read voltage RD3 to the selection word line WL. In a read operation with respect to the CSB2 page, the memory device 110 may identify the fourteenth and fifteenth states S14 and S15, the eighth and ninth states S8 and S9, and the second and third states S2 and S3 by sequentially applying the fourteenth read voltage RD14, the eighth read voltage RD8, and the second read voltage RD2 to the selection word line WL. In a read operation with respect to the MSB page, the memory device 110 may identify the fifteenth and sixteenth states S15 and S16, the twelfth and thirteenth states S12 and S13, the tenth and eleventh states S10 and S11, and the fifth and sixth states S5 and S6 by applying the fifteenth read voltage RD15, the twelfth read voltage RD12, the tenth read voltage RD10, and the fifth read voltage RD5 to the selection word line WL.

In operation S720 of FIG. 7, the memory controller 120 may obtain the ECC data ECC_DEC by performing error correction decoding on the first read data read from the memory device 110 according to the first read operation by using the ECC circuit 122. The ECC circuit 122 may provide the ECC data ECC_DEC of the first read data to the memory check circuit 124. The memory check circuit 124 may count the states S1 through S16 of the ECC data ECC_DEC and thus a first count number of each of the states S1 through S16.

The first read data may include data bits programmed and read according to write data, and the parity bits of the write data. The ECC data ECC_DEC of the first read data may refer to the data bits. The memory check circuit 124 may count the states S1 through S16 represented as the values of the data bits and thus store a first count number of each of the states S1 through S16. According to an example embodiment, the memory check circuit 124 may count the states S1 through S16 represented as the values of the data bits and the parity bits and thus store a first count number of each of the states S1 through S16.

In operation S730, the memory controller 120 may instruct the memory device 110 to perform the second read operation. The second read operation may be performed using low read voltages LRD1 through LRD16 in order to predict retention deterioration in which the threshold voltages of the memory cells change. The low read voltages LRD1 through LRD16 may be set as lower voltage levels than corresponding ones of the read voltages RD1 through RD15, respectively, for identifying the states S1 through S16, in order to detect a tail bit generated in each of the states S1 through S16. According to an example embodiment, the second read operation may use the read voltages RD1 through RD15 instead of the low read voltages LRD1 through LRD16.

In the second read operation of the memory device 110, a page read operation with respect to each of the LSB page, the CSB1 page, the CSB2 page, and the MSB page may be performed using the low read voltages LRD1 through LRD15. For brevity of illustration, FIG. 9A illustrates a second read operation with respect to the MSB page.

As shown in FIG. 9A, the memory device 110 may sense memory cells that are turned on or turned off by the fifteenth low read voltage LRD15, by applying the fifteenth low read voltage LRD15 to the selection word line WL in the read operation with respect to the MSB page. The number of memory cells that are turned off by the fifteenth low read voltage LRD15 may be used to measure retention deterioration of the sixteenth state S16. Then, the memory device 110 may measure the number of memory cells that are turned off by sequentially applying the twelfth low read voltage LRD12, the tenth low read voltage LRD10, and the fifth low read voltage LRD5 to the selection word line WL, and may predict retention deterioration of the thirteenth state S13, the eleventh state S11, and the sixth state S6.

In this context, in a read operation with respect to the CSB2 page, the memory device 110 may measure the number of memory cells that are turned off by sequentially applying the fourteenth low read voltage LRD14, the eighth low read voltage LRD8, and the second low read voltage LRD2 to the selection word line WL, and may predict retention deterioration of the fifteenth state S15, the ninth state S9, and the third state S3. In a read operation with respect to the CSB1 page, the memory device 110 may measure the number of memory cells that are turned off by sequentially applying the thirteenth low read voltage LRD13, the ninth low read voltage LRD9, the seventh low read voltage LRD7, and the third low read voltage LRD3 to the selection word line WL, and may predict retention deterioration of the fourteenth state S14, the tenth state S10, the eighth state S8, and the fourth state S4. In a read operation with respect to the LSB page, the memory device 110 may measure the number of memory cells that are turned off by sequentially applying the eleventh low read voltage LRD11, the sixth low read voltage LRD6, the fourth low read voltage LRD4, and the first low read voltage LRD1 to the selection word line WL, and may predict retention deterioration of the twelfth state S12, the seventh state S7, the fifth state S5, and the second state S2.

In operation S740 of FIG. 7, the memory controller 120 may detect the number of errors of the second read data based on the second read data read from the memory device 110 in the second read operation and the ECC data ECC_DEC. For example, the memory controller 120 may detect the number of errors of the second read data by comparing the second read data read from the memory device 110 in the second read operation with the ECC data ECC_DEC. The memory check circuit 124 may count the number of memory cells that are turned off in each of the states S1 through S16 of the second read data, and thus may store a second count number of each of the states S1 through S16. The memory check circuit 124 may detect the number of errors of the second read data by calculating a difference between the first count number of each of the states S1 through S16 of the ECC data ECC_DEC and the second count number of each of the states S1 through S16 of the second read data.

For example, in the sixteenth state S16, FIG. 9B illustrates a difference 912 (hatched portion) between a first count number 901 of the ECC data ECC_DEC and a second count number 902 of the second read data. The difference 912 of the sixteenth state S16 means that data of the sixteenth state S16 has been deteriorated or destroyed due to presence of tail bits according to retention deterioration, and indicates the number of errors of the sixteenth state S16.

In operation S740, the memory controller 120 may detect the number of errors of the second read data by using write data provided to be programmed to the memory cells of the selection word line WL instead of the ECC data ECC_DEC. The memory controller 120 may count the states S1 through S16 constituting the write data and thus store a first count number of each of the states S1 through S16. The memory check circuit 124 may detect the number of errors of the second read data by calculating a difference between the first count number of each of the states S1 through S16 of the write data and the second count number of each of the states S1 through S16 of the second read data.

In operation S750, the memory controller 120 may determine whether the number of errors detected in each of the states S1 through S16 is equal to or greater than a first threshold TH1. The first threshold TH1 may be set as the number of memory cells that are determined to be hardware failures because of the tail bits due to retention deterioration.

When the number of detected errors is less than the first threshold TH1, the memory check circuit 124 may determine that the data stored in the memory cells has relatively high reliability, and may conclude the check read operation. On the other hand, when the number of detected errors is equal to or greater than the first threshold TH1, the memory check circuit 124 may determine that the data stored in the memory cells has relatively low reliability, and operation S760 may be performed. In operation S760, the memory controller 120 may perform a reclaim operation on the memory device 110. In the reclaim operation, the data stored in the memory cells connected to the selection word line WL may be programmed to memory cells connected to another word line, threshold voltage distributions for the memory cells connected to the selection word line WL may be adjusted using a re-programming method, or the valid data of a memory block including the selection word line WL may be newly written to another memory block. The reclaim operation may be referred to as a refresh operation. Data reliability may be recovered through the reclaim or refresh operation.

Accordingly, because the storage device 100 counts the number of errors of the second read data read out in the subsequent second read operation, based on the ECC data ECC_DEC of the first read data read out in the preceding first read operation, the storage device 100 may perform a reliability check during a relatively short time period.

Figure 10:
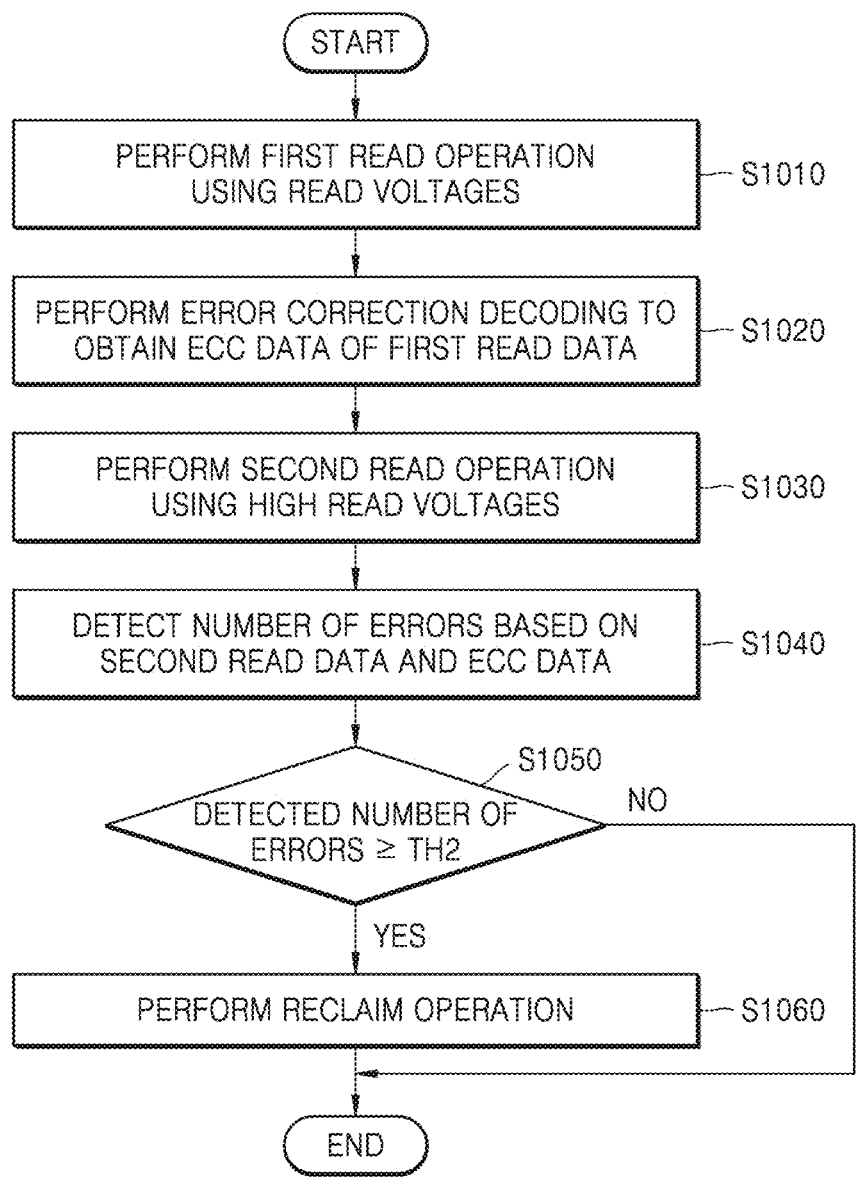
FIGS. 10 through 11B are views for explaining a check read operation according to an example embodiment of the inventive concepts.
Figure 11A:
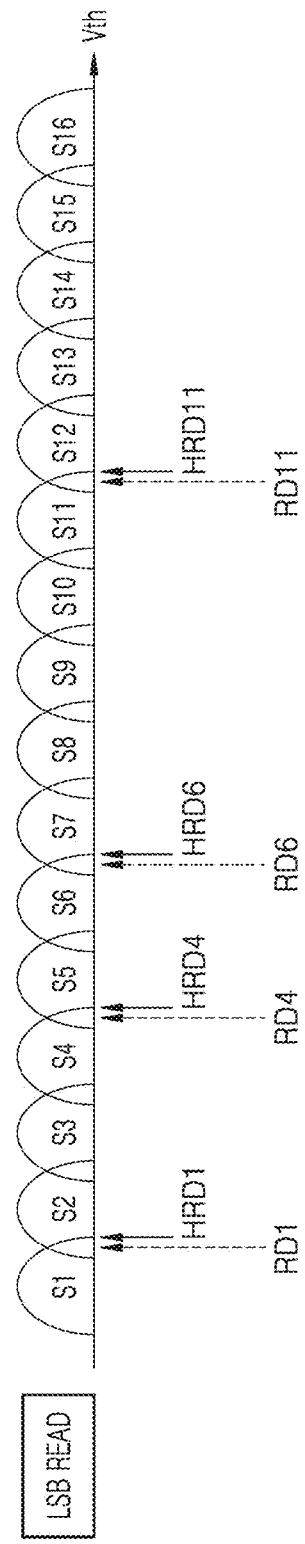
Figure 11B:
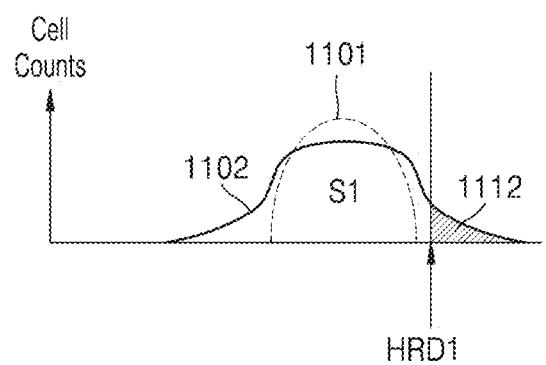

FIGS. 10 through 11B are views for explaining a check read operation according to an example embodiment of the inventive concepts. FIG. 10 is a flowchart of the check read operation, and FIGS. 10A and 10B are charts for explaining a second read operation included in the check read operation.

Referring to FIGS. 1, 8, and 10, in operation S1010, the memory controller 120 may instruct the memory device 110 to perform a first read operation. In the first read operation of the memory device 110, as shown in FIG. 8, a page read operation with respect to each of the LSB page, the CSB1 page, the CSB2 page, and the MSB page may be performed using the read voltages RD1 through RD15.

In operation S1020, the memory controller 120 may obtain the ECC data ECC_DEC by performing error correction decoding on the first read data read from the memory device 110 according to the first read operation by using the ECC circuit 122. The ECC circuit 122 may provide the ECC data ECC_DEC of the first read data to the memory check circuit 124. The memory check circuit 124 may count the states S1 through S16 of the ECC data ECC_DEC and thus a first count number of each of the states S1 through S16.

In operation S1030, the memory controller 120 may instruct the memory device 110 to perform the second read operation. The second read operation may be performed using high read voltages HRD1 through HRD15 in order to predict disturb deterioration in which the threshold voltages of the memory cells change. The high read voltages HRD1 through HRD15 may be set as higher voltage levels than corresponding ones of the read voltages RD1 through RD15, respectively, for identifying the states S1 through S16, in order to detect a tail bit generated in each of the states S1 through S16. According to an example embodiment, the second read operation may use the read voltages RD1 through RD15 instead of the high read voltages LRD1 through LRD15.

In the second read operation of the memory device 110, a page read operation with respect to each of the LSB page, the CSB1 page, the CSB2 page, and the MSB page may be performed using the high read voltages HRD1 through HRD15. For brevity of illustration, FIG. 11A illustrates a second read operation with respect to the LSB page.

As shown in FIG. 11A, the memory device 110 may sense memory cells that are turned on or turned off by the eleventh high read voltage HRD11, by applying the eleventh high read voltage HRD11 to the selection word line WL in the read operation with respect to the LSB page. The number of memory cells that are turned on by the eleventh high read voltage HRD11 may be used to measure disturb deterioration of the eleventh state S11. Then, the memory device 110 may measure the number of memory cells that are turned on by sequentially applying the sixth high read voltage HRD6, the fourth high read voltage HRD4, and the first high read voltage HRD1 to the selection word line WL, and may predict disturb deterioration of the sixth state S6, the fourth state S4, and the first state S1.

In this context, in a read operation with respect to the CSB1 page, the memory device 110 may measure the number of memory cells that are turned on by sequentially applying the thirteenth high read voltage HRD13, the ninth high read voltage HRD9, the seventh high read voltage HRD7, and the third high read voltage HRD3 to the selection word line WL, and may predict disturb deterioration of the thirteenth state S13, the ninth state S9, the seventh state S7, and the third state S3. In a read operation with respect to the CSB2 page, the memory device 110 may measure the number of memory cells that are turned on by sequentially applying the fourteenth high read voltage HRD14, the eighth high read voltage HRD8, and the second high read voltage HRD2 to the selection word line WL, and may predict disturb deterioration of the fourteenth state S14, the eighth state S8, and the second state S2. In a read operation with respect to the MSB page, the memory device 110 may measure the number of memory cells that are turned on by sequentially applying the fifteenth high read voltage HRD15, the twelfth high read voltage HRD12, the tenth high read voltage HRD10, and the fifth high read voltage HRD5 to the selection word line WL, and may predict retention deterioration of the eleventh state S15, the sixth state S6, the fourth state S4, and the first state S1.

In operation S1040 of FIG. 10, the memory controller 120 may detect the number of errors of the second read data based on the second read data read from the memory device 110 in the second read operation and the ECC data ECC_DEC. For example, the memory controller 120 may detect the number of errors of the second read data by comparing the second read data read from the memory device 110 in the second read operation with the ECC data ECC_DEC. The memory check circuit 124 may count the number of memory cells that are turned on in each of the states S1 through S16 of the second read data, and thus may store a second count number of each of the states S1 through S16. The memory check circuit 124 may detect the number of errors of the second read data by calculating a difference between the first count number of each of the states S1 through S16 of the ECC data ECC_DEC and the second count number of each of the states S1 through S16 of the second read data.

For example, in the first state S1, FIG. 11B illustrates a difference 1112 between a first count number 1101 of the ECC data ECC_DEC and a second count number 1102 of the second read data. The difference 1112 of the first state S1 means that data of the first state S1 has been deteriorated or destroyed due to presence of tail bits according to disturb deterioration, and indicates the number of errors of the first state S1.

In operation S1050, the memory controller 120 may determine whether the number of errors detected in each of the states S1 through S16 is equal to or greater than a second threshold TH2. The second threshold TH2 may be set as the number of memory cells that are determined to be hardware failures because of the tail bits due to disturb deterioration.

When the number of detected errors is less than the second threshold TH2, the memory check circuit 124 may determine that the data stored in the memory cells has relatively high reliability, and may conclude the check read operation. On the other hand, when the number of detected errors is equal to or greater than the second threshold TH2, the memory check circuit 124 may determine that the data stored in the memory cells has relatively low reliability, and operation S1060 may be performed. In operation S1060, the memory controller 120 may perform a reclaim (or refresh) operation on the memory device 110. Data reliability may be recovered through the claim or refresh operation.

Figure 12:
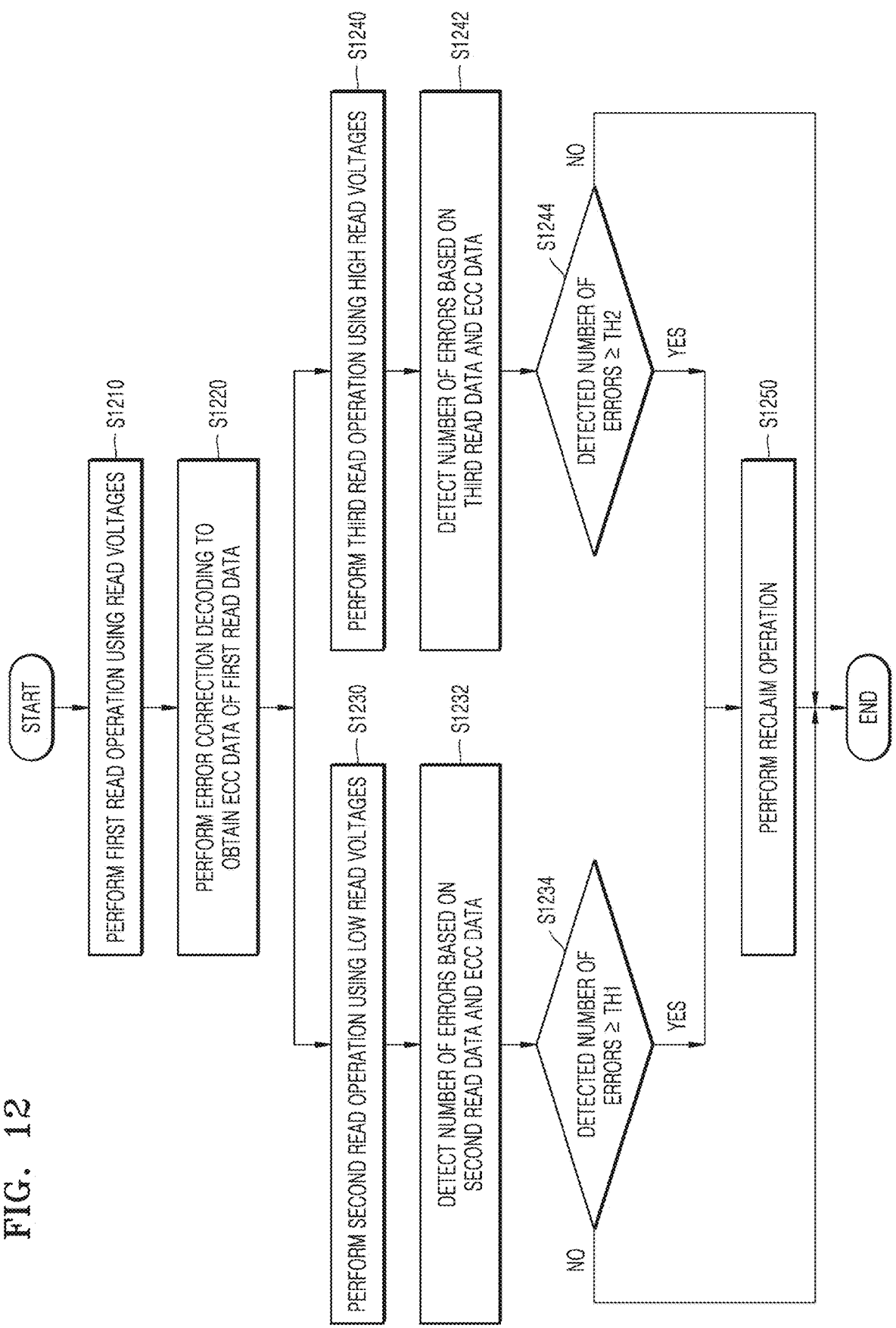
FIG. 12 is a flowchart of a check read operation according to an example embodiment of the inventive concepts.

FIG. 12 is a flowchart of a check read operation according to an example embodiment of the inventive concepts. In the check read operation of FIG. 12, a data reliability check of memory cells according to retention deterioration and a data reliability check of memory cells according to disturb deterioration may be performed in parallel.

Referring to FIGS. 1, 8, and 12, operations S1210 and S1220 may be performed the same as operations S710 and S720 of FIG. 7 and operations S1010 and S1020 of FIG. 10.

In operation S1210, the memory controller 120 may instruct the memory device 110 to perform a first read operation. In operation S1220, the memory controller 120 may obtain the ECC data ECC_DEC by performing error correction decoding on the first read data read from the memory device 110 according to the first read operation, and may store a first count number of each of the states S1 through S16 by counting the states S1 through S16 of the ECC data ECC_DEC.

In operations S1230, S1232, and S1234, the memory controller 120 may perform a second read operation of predicting retention deterioration of memory cells by using the low read voltages LRD1 through LRD15. Operations S1230, S1232, and S1234 may be performed the same as operations S730, S740, and S750 of FIG. 7. In operation S1234, the number of errors that are determined as hardware failures of each of the states S1 through S16 of the memory cells may be predicted.

In operations S1240, S1242, and S1244, the memory controller 120 may perform a third read operation of predicting disturb deterioration of memory cells by using the high read voltages HRD1 through HRD15. Operations S1240, S1242, and S1244 may be performed the same as operations S1030, S1040, and S1050 of FIG. 10. In operation S1244, the number of errors that are determined as hardware failures of each of the states S1 through S16 of the memory cells may be predicted.

In operations S1234 and S1244, when the number of errors of each of the states S1 through S16 of the memory cells is less than the first and second thresholds TH1 and TH2, respectively, the memory controller 120 may determine that the data stored in the memory cells has relatively high reliability, and may conclude the check read operation. On the other hand, when the number of errors is equal to or greater than the first and second thresholds TH1 and TH2, the memory check circuit 124 may determine that the data stored in the memory cells has relatively low reliability, and operation S1250 may be performed. In operation S1250, the memory controller 120 may perform a reclaim or refresh operation.

Figure 13:
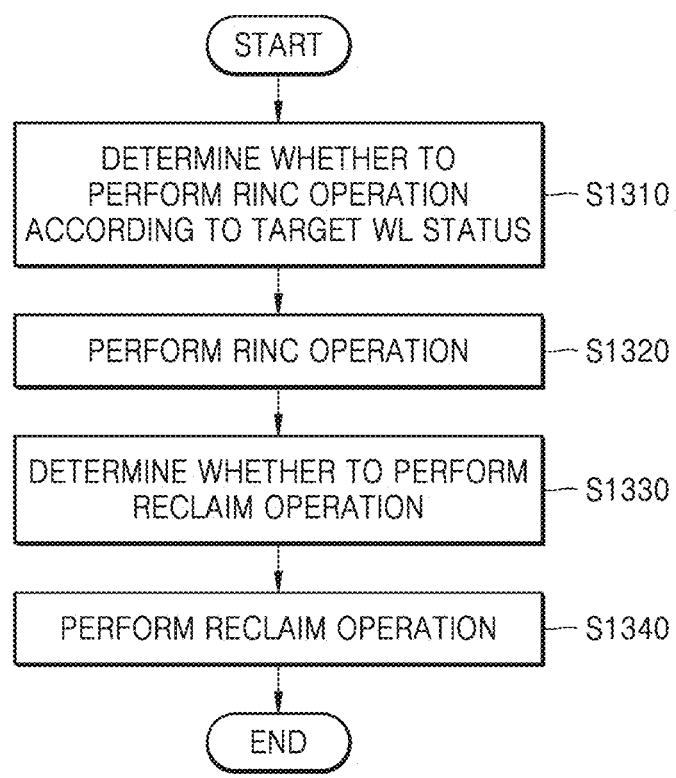
FIG. 13 is a flowchart of a check read operation according to an example embodiment of the inventive concepts.

FIG. 13 is a flowchart of a check read operation according to an example embodiment of the inventive concepts.

Referring to FIGS. 7 through 13, in operation S1310, the memory controller 120 may determine whether to perform a Random Interval Neighbor Check (RINC) operation according to a state of the selection word line WL. The RINC operation may be a dummy read operation of at least one neighboring word line WL adjacent to a selected word line WL or a dummy read operation of at least one open word line. The open word line refers to a non-selected word line where programming has not been performed, which is over the selected word line WL. The memory controller 120 may determine whether to perform the RINC operation of the selected word line WL, based on the number of error bits due to deterioration of the memory cells.

In operation S1320, the memory check circuit 124 may perform the RINC operation, when the number of error bits due to deterioration of the memory cells exceeds a value previously determined for a reliability check. According to an example embodiment, the memory controller 120 may perform the RINC operation, based on one of a number of program/erase (P/E) cycles of the memory device 110, a program count, a read count, an erase count, an error rate, threshold voltage change information, wear level information, deterioration information, data input/output time information, temperature information, location information, structure information, and state information of adjacent cells.

In operation S1330, the memory controller 120 may determine whether to perform a reclaim operation, according to a result of the RINC operation. When the number of errors exceeds a certain value as a result of the RINC operation, a reclaim operation may be determined to be performed. In operation S1340, the memory controller 120 may perform a reclaim (or refresh) operation on the memory device 110. Data reliability may be recovered through the claim or refresh operation.

Figure 14:
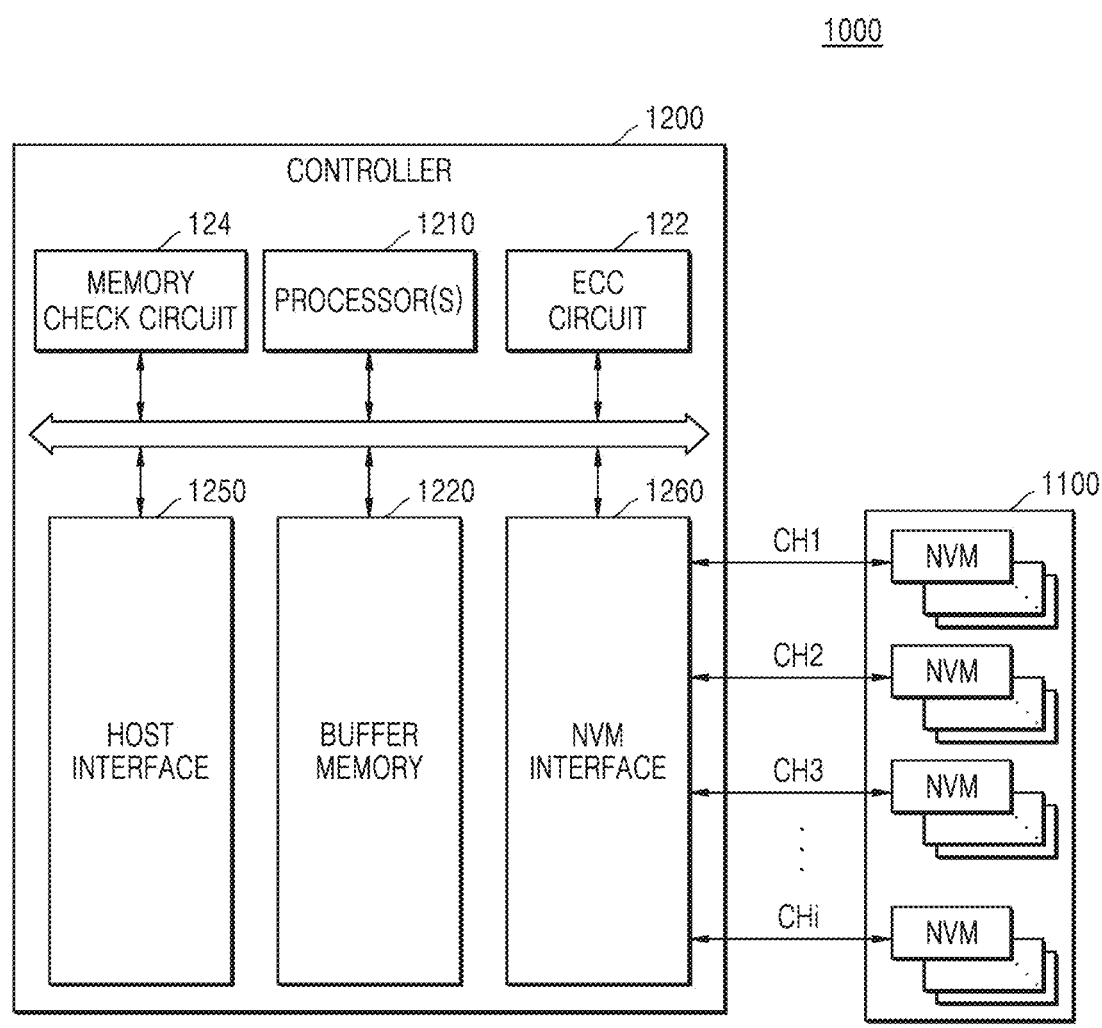
FIG. 14 is a block diagram of a solid-state drive or solid-state disk (SSD) which performs a memory check operation according to an example embodiment of the inventive concepts.

FIG. 14 is a block diagram of a solid-state drive or solid-state disk (SSD) 1000 which performs a memory check operation according to an example embodiment of the inventive concepts.

Referring to FIG. 14, the SSD 1000 includes a plurality of non-volatile memory devices 1100 and an SSD controller 1200. The plurality of non-volatile memory devices 1100 may be implemented using the above-described memory device 110. The non-volatile memory devices 110 may include a plurality of memory blocks, each of the plurality of memory blocks may include memory cells connected to a plurality of word lines, and the memory cells may be programed into a plurality of states according to write data.

The SSD controller 1200 is connected to the non-volatile memory devices 1100 through a plurality of channels CH1 through CH4. The SSD controller 1200 includes at least one processor 1210, the ECC circuit 122, the memory check circuit 124, a buffer memory 1220, a host interface 1250, and a non-volatile memory interface 1260. The buffer memory 1220 may temporarily store data necessary for driving the SSD controller 1200. The ECC circuit 122 may obtain error-corrected data by performing error correction decoding on first read data read out in a first read operation with respect to memory cells connected to a selection word line of a non-volatile memory device selected from among the non-volatile memory devices 1100. The memory check circuit 124 may detect the number of errors of second read data read out in a second read operation with respect to the memory cells connected to the selection word line, based on the error-corrected data.

Various circuits and/or functional blocks (e.g., a voltage generator 119, a row decoder 394, a page buffer unit 118, a control logic circuit 114, a memory check circuit 124, a processor 1210, an ECC circuit 122, a counter 125, a comparator 127, and/or a register 129) in the figures and described above may be implemented in processing circuitry such as hardware including logic circuits or a hardware/software combination such as a processor executing software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

A storage device according to some example embodiments of the inventive concepts counts the number of errors of subsequent read data, based on ECC data of preceding read data, and thus may perform a reliability check during a relatively short time period.

While the inventive concepts have been particularly shown and described with reference to some example embodiments thereof, it will be understood that various changes in form and details may be made therein without departing from the spirit and scope of the following claims.

What is claimed is:

1. A storage device comprising:
    a non-volatile memory device including a plurality of memory blocks, each of the plurality of memory blocks including memory cells connected to a plurality of word lines, the memory cells configured to be programmed into a plurality of states according to write data; and
    a memory controller configured to check reliability of first memory cells, from among the memory cells, connected to a selection word line from among the plurality of word lines,
    wherein the memory controller is further configured to,
    perform a first read operation with respect to the first memory cells connected to the selection word line by applying a first read voltage to the selection word line,
    obtain error-corrected data by performing error correction decoding on first read data read out by the first read operation,
    determine a first count number of the plurality of states based on the obtained error-corrected data,
    perform a second read operation with respect to the first memory cells connected to the selection word line by applying a second read voltage to the selection word line different than the first read voltage, determine a second count number of the plurality of states based on the second read operation, and count a number of errors of second read data read out by the second read operation, based on the first and second count numbers, the second read data being a raw data read out from the first memory cells by the second read operation.

2. The storage device of claim 1, wherein the memory controller is configured to calculate the first count number of each of the plurality of states by counting each of the plurality of states for the error-corrected data.

3. The storage device of claim 2, wherein the memory controller is further configured to, calculate the second count number of each of the plurality of states by counting a number of turned off memory cells that are turned off by the second read voltage, and count the number of the errors of the second read data based on the first count number of each of the plurality of states and the second count number of each of the plurality of states.

4. The storage device of claim 3, wherein the second read voltage is set to have a lower voltage level than the first read voltage.

5. The storage device of claim 2, wherein the memory controller is further configured to, calculate the second count number of each of the plurality of states by counting a number of turned on memory cells that are turned on by the second read voltage, and count the number of the errors of the second read data based on the first count number of each of the plurality of states and the second count number of each of the plurality of states.

6. The storage device of claim 5, wherein the second read voltage is set to have a higher voltage level than the first read voltage.

7. The storage device of claim 1, wherein the memory controller is further configured to perform a reclaim operation, based on the number of the errors of the second read data.

8. The storage device of claim 1, wherein each of the first read data and the second read data comprises data bits of the write data and parity bits for the write data, and the memory controller is further configured to count the number of the errors of the second read data in relation to the data bits or count the number of the errors of the second read data in relation to the data bits and the parity bits.

9. A memory controller for checking reliability of a memory device, the memory controller comprising:

an error correction code (ECC) circuit configured to obtain error-corrected data by performing error correction decoding on first read data read out in a first read operation with respect to first memory cells connected to a selection word line of the memory device, and determine a first count number of a plurality of states based on the obtained error-corrected data; and a memory check circuit configured to detect a number of errors of second read data read out in a second read operation with respect to the first memory cells connected to the selection word line, based on the first count and a second count of the plurality of states based on the second read operation, the second read data being a raw data read out from the first memory cells in the second read operation, wherein the first read operation is performed by applying a first read voltage to the selection word line, and wherein the second read operation is performed by applying a second read voltage to the selection word line different than the first read voltage.

10. The memory controller of claim 9, wherein the memory check circuit is further configured to perform a reclaim operation of the memory device, based on the number of the errors of the second read data.

11. The memory controller of claim 10, wherein the memory controller is configured to perform the reclaim operation such that data stored in the first memory cells connected to the selection word line is programmed to second memory cells connected to another word line.

12. The memory controller of claim 10, wherein the memory controller is configured to perform the reclaim operation such that threshold voltage distributions for the first memory cells connected to the selection word line are adjusted by using a re-programming method.

13. The memory controller of claim 10, wherein the memory controller is configured to perform the reclaim operation such that valid data of a memory block including the selection word line is newly written to another memory block.

14. The memory controller of claim 9, wherein the memory check circuit is further configured to perform a dummy read operation of the memory device, based on the number of the errors of the second read data.

15. The memory controller of claim 14, wherein the dummy read operation is performed with respect to second memory cells connected to at least one word line adjacent to the selection word line.

16. The memory controller of claim 14, wherein the dummy read operation is performed with respect to second memory cells connected to at least one open word line located over the selection word line.

17. An operation method of a storage device including at least one non-volatile memory device and a memory controller configured to perform a check read operation of the at least one non-volatile memory device, the operation method comprising:

performing, by the memory controller, a first read operation with respect to first memory cells, which are programmed into a plurality of states according to write data and are connected to a selection word line of a selected memory block from among memory blocks of the at least one non-volatile memory device, by applying a first read voltage to the selection word line;

obtaining, by the memory controller, error-corrected data by performing error correction decoding on first read data read out in the first read operation;

calculating, by the memory controller, a first count number of each state by counting states of the error-corrected data;

performing, by the memory controller, a second read operation with respect to the first memory cells connected to the selection word line by applying a second read voltage to the selection word line different than the first read voltage;

calculating, by the memory controller, a second count number of each state by counting states of second read data read out by the second read operation;

counting, by the memory controller, a number of errors of the second read data based on the first count number of each state and the second count number of each state, the second read data being a raw data read out from the first memory cells by the second read operation; and performing, by the memory controller, a reclaim operation of the memory device, based on the number of the errors of the second read data.

18. The operation method of claim 17, wherein the second read voltage is set to have a lower voltage level than the first read voltage.

19. The operation method of claim 18, wherein the second read voltage is set to have a higher voltage level than the first read voltage.

* * * * *